(12) United States Patent
Deguchi et al.

(10) Patent No.: US 6,659,661 B2
(45) Date of Patent: Dec. 9, 2003

(54) SUBSTRATE PROCESSING APPARATUS

(75) Inventors: Masatoshi Deguchi, Kikuchi-gun (JP); Eiichi Sekimoto, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/078,370

(22) Filed: Feb. 21, 2002

(65) Prior Publication Data

US 2002/0114632 A1 Aug. 22, 2002

(30) Foreign Application Priority Data

Feb. 22, 2001 (JP) ........................................ 2001-047125

(51) Int. Cl.[7] ............................. G03D 5/00; B65G 49/07
(52) U.S. Cl. ........................................ 396/611; 118/52
(58) Field of Search ............................ 396/611; 118/52, 118/54, 56, 326, 500, 716, 300; 29/25.01

(56) References Cited

U.S. PATENT DOCUMENTS 6,215,545 B1    4/2001   Matsuyama
6,287,025 B1 *  9/2001   Matsuyama ................. 396/611
6,379,056 B1 *  4/2002   Ueda .......................... 396/611
6,402,400 B1 *  6/2002   Ueda et al. ................. 396/611
6,402,401 B1 *  6/2002   Ueda et al. ................. 396/611

* cited by examiner

*Primary Examiner*—Alan A. Mathews
(74) *Attorney, Agent, or Firm*—Oblon, Spivak, McClelland, Maier & Neustad, P.C.

(57) ABSTRACT

The present invention is a substrate processing apparatus for performing processing of a substrate including: a heat treatment unit provided in a casing of the processing apparatus and having a heating section in which a heat treatment of the substrate is performed; a duct provided on a side part on the heating section side of the casing; and a cooling flow passage provided in the duct for allowing a cooling fluid to flow therethrough. Heat generated from the heating section is prevented from conducting by an air current flowing in the duct, and further the heat is absorbed by the cooling fluid. Therefore, it is possible to prevent the heat from conducting to the outside of the casing.

11 Claims, 14 Drawing Sheets

SUBSTRATE PROCESSING APPARATUS

BACKGROUND OF THE INVENTION

1. Field of the Invention

The present invention relates to a processing apparatus for a substrate.

2. Description of the Related Art

A photolithography process, for example, in semiconductor device fabrication processes is performed in a coating and developing treatment system. The coating and developing treatment system includes a resist coating unit for forming a resist film on a wafer surface, a developing unit for performing development for the wafer after exposure processing, a heat treatment unit for performing a thermal treatment for the wafer before the coating treatment, before and after the exposure processing and after the developing treatment, a cooling unit and the like. The processing units are placed together in a particular area which is referred to as a processing station in the coating and developing treatment system so as to perform efficiently, for example, a series of photolithography processes in sequence. A carrier unit which can access to each processing unit and carries the wafer is provided at the center part of the processing station.

Each processing unit is controlled to a temperature suitable for each processing. For example, a heating plate for heating the wafer is maintained at a high temperature in the heat treatment unit, and a cooling plate for cooling the wafer is maintained at a low temperature.

However, a plurality of heat treatment units are often provided in the above-described processing station, and thus the temperature of an atmosphere in the processing station increases due to radiation heat discharged from the heat treatment units. If the wafer is carried by the aforementioned carrier in the atmosphere having thus increased temperature, the wafer increases in temperature during the carriage due to the atmosphere having the increased temperature. This may produce adverse effects that, for example, even though the wafer is cooled to a predetermined temperature in the cooling unit to stop the chemical reaction of a coating film on the wafer, the increase in temperature causes the reaction of the coating film to occur again and the like.

As a result, an increase in temperature in the processing station increases the wafer temperature to exert influence finally on a line width of a circuit pattern which is formed on the wafer, causing a reduction in yields.

SUMMARY OF THE INVENTION

The present invention is made in view of the above point, and it is an object of the invention to provide a processing apparatus for preventing an increase in temperature, for example, of an atmosphere in a processing station due to radiation heat from a heat treatment unit.

In order to achieve the object, a substrate processing apparatus for performing processing of a substrate of the present invention includes: a heat treatment unit which is provided in a casing of the processing apparatus and in which a heat treatment of the substrate is performed; a heat insulating member provided on a side part of the casing for preventing heat from the heat treatment unit from conducting to an outside of the casing; and a heat transporter for transporting heat stored in the heat insulating member to an outside of the processing apparatus.

According to another aspect, the substrate processing apparatus of the present invention includes: a heat treatment unit which is provided in a casing of the processing apparatus and in which a heat treatment of the substrate is performed; a duct provided on a side part of the casing; and an air current generating mechanism for generating an air current flowing in the duct.

According to still another aspect, the substrate processing apparatus of the present invention is a substrate processing apparatus for performing processing of a substrate including: a heat treatment unit provided in a casing of the processing apparatus and having a heating section in which a heat treatment of the substrate is performed; a duct provided on a side part on the heating section side of the casing; and a cooling flow passage provided in the duct for allowing a cooling fluid to flow therethrough.

According to the present invention, it is possible to insulate the heat from the heat treatment unit by the heat insulating member and to transport the heat stored in the heat insulating member to the outside of the processing apparatus by the heat transporter. This makes it possible to prevent an increase in temperature of the atmosphere outside the casing due to the heat generated in the heat treatment unit being discharged to the outside of the casing. Therefore, even if carriage of the substrate or the like is performed outside the casing, the substrate is not influenced by the heat from the heat treatment unit but can keep an appropriate temperature.

Further, according to the present invention, by providing the duct on the side part of the casing of the processing apparatus and providing the air current generating mechanism for generating the air current flowing in the duct, the heat conducted from the heat treatment unit to the duct can be exhausted to a predetermined place by the air current flowing in the duct. This prevents the heat from the heat treatment unit from being discharged to the outside of the casing, so as to prevent an increase in temperature of the atmosphere outside the casing.

Furthermore, according to the present invention, since the cooling flow passage provided in the duct for allowing the cooling fluid to flow therethrough is provided, heat is absorbed by the cooling fluid. This further prevents the heat from the heat treatment unit from being discharged to the outside of the casing so as to prevent an increase in temperature of the atmosphere outside the casing.

DETAILED DESCRIPTION OF THE PREFERRED EMBODIMENT

Figure 1:
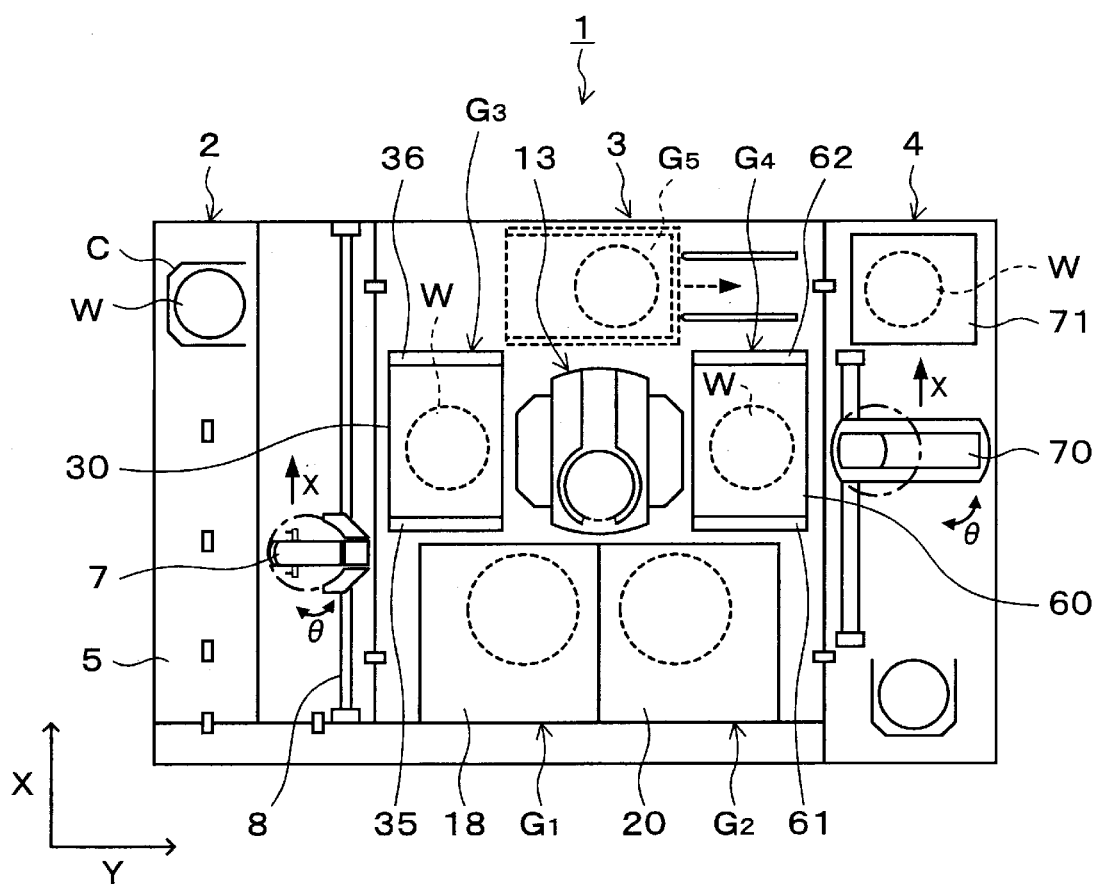
FIG. 1 is a schematic plan view showing a configuration of a coating and developing treatment system including a third processing apparatus according to an embodiment.
Figure 2:
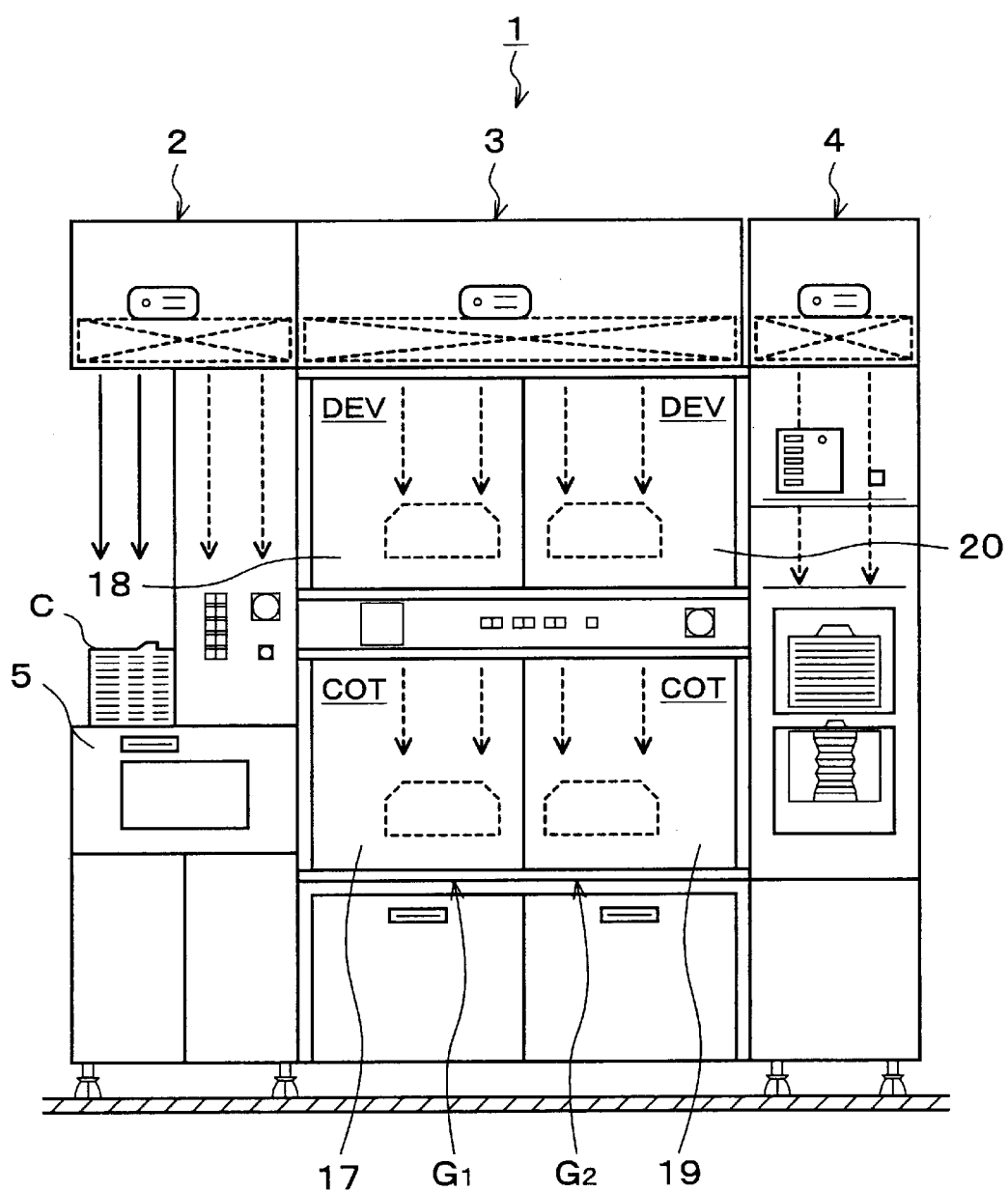
FIG. 2 is a front view of the coating and developing treatment system in FIG. 1.
Figure 4:
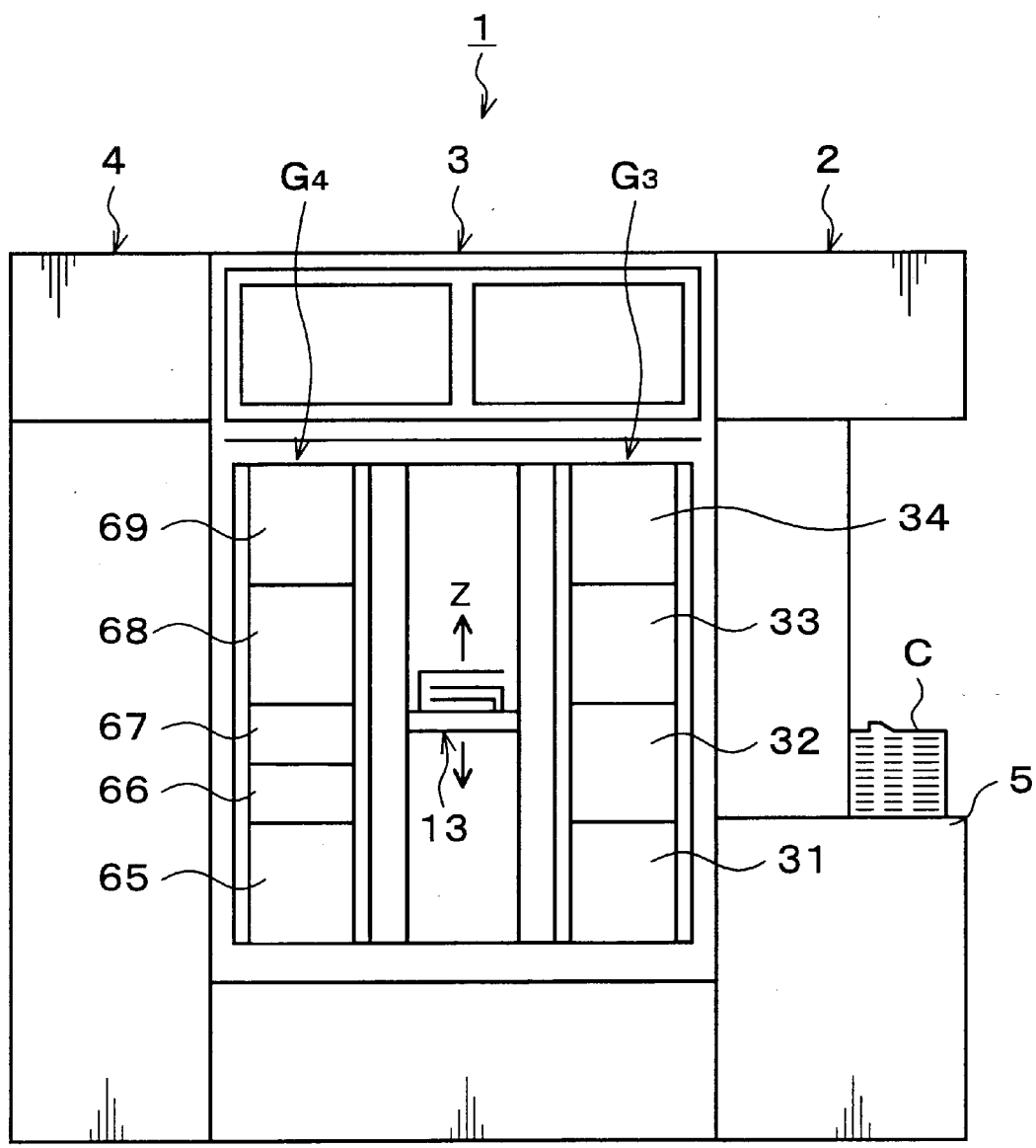
FIG. 4 is a rear view of the coating and developing treatment system in FIG. 1.

Hereinafter, a preferred embodiment of the present invention will be explained to detail the present invention. FIG. 1 is a schematic plan view of a coating and developing treatment system 1 including processing apparatuses as substrate processing apparatuses according to the present invention, FIG. 2 is a front view of the coating and developing treatment system 1, and FIG. 4 is a rear view of the coating and developing treatment system 1.

As shown in FIG. 1, the coating and developing treatment system 1 has a configuration in which a cassette station 2 for carrying, for example, 25 wafers W in a unit of cassette from/to the outside to/from the coating and developing treatment system 1 and for carrying the wafers W to/from a cassette C, a processing station 3 composed of various kinds of processing units which are disposed in multi-tiers, for performing predetermined processing for the wafers W one by one in coating and developing processes, and an interface section 4 for delivering/receiving the wafers W to/from a not-shown aligner which is provided adjacent to the processing station 3 are integrally connected.

In the cassette station 2, a plurality of the cassettes C are mountable in predetermined positions on a cassette mounting table 5, which serves as a mounting portion, in a line in an X-direction (a vertical direction in FIG. 1). Furthermore, a wafer carrier 7, which is transportable in the alignment direction of the cassettes (the X-direction) and in an alignment direction of the wafers W housed in the cassette C (a Z-direction; a vertical direction), is provided to be movable along a carrier path 8 so that it can selectively access to each of the cassettes C.

The wafer carrier 7 has an alignment function for aligning the wafers W. The wafer carrier 7 is also configured to be able to access to an extension unit 33 included in a third processing apparatus G3 on the processing station 3 side as will be described below.

In the processing station 3, a main carrier 13 is provided in a center part thereof, and various kinds of the processing units are multi-tiered on a periphery of the main carrier 13 to constitute processing apparatuses. In the coating and developing treatment system 1, where four processing apparatuses G1, G2, G3 and G4 are arranged, the first and the second processing apparatuses G1 and G2 are disposed on a front side of the coating and developing treatment system 1, the third processing apparatus G3 as the processing apparatus is disposed adjacent to the cassette station 2, and the fourth processing apparatus G4 is disposed adjacent to the interface section 4. Furthermore, a fifth processing apparatus G5 depicted by a broken line is allowed to be additionally disposed on a rear side as an option. The main carrier 13 is capable of carrying the wafers W to/from the various kinds of later described processing units which are disposed in these processing apparatuses G1, G2, G3, G4 and G5. Incidentally, the number and the arrangement of the processing apparatuses vary depending on the kind of processing performed on the wafers W, and the number of the processing apparatuses is arbitrarily selected.

In the first processing apparatus G1, for example, as shown in FIG. 2, a resist coating unit 17 for supplying a resist solution onto the wafer W to form a resist film and a developing unit 18 for developing the wafer W after exposure are two-tiered in the order from the bottom. Similarly, in the processing apparatus G2, a resist coating unit 19 and a developing unit 20 are two-tiered in the order from the bottom.

Figure 3:
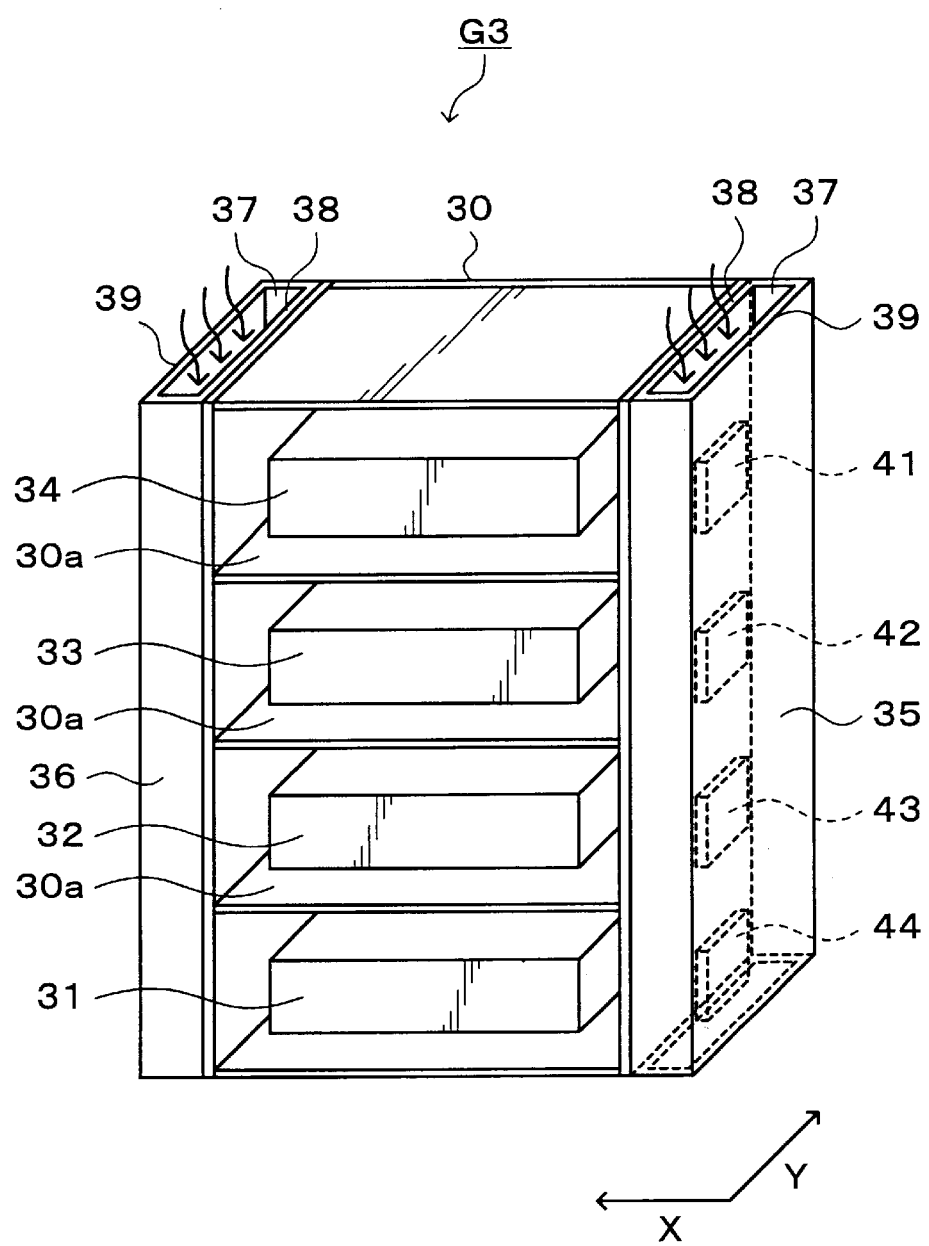
FIG. 3 is a perspective view schematically showing a configuration of the third processing apparatus.

The third processing apparatus G3, as shown in FIG. 3, has a casing 30 in the form of a substantially rectangular solid. In the casing 30, a plurality of horizontal plates 30a for dividing the inside of the casing 30 into a plurality of rooms are provided so that a plurality of processing units can be multi-tiered. In the casing 30, for example, as shown in FIG. 4, a cooling unit 31 for cooling the wafer W, an adhesion unit 32 for enhancing adhesion between a resist solution and the wafer W, the extension unit 33 for keeping the wafer W on stand-by therein, and a pre-baking unit 34 as a heat treatment unit for drying a solvent in the resist solution are, for example, four-tiered in the order from the bottom.

On both side faces in the X-direction of the casing 30, ducts 35 and 36 as heat insulating members for allowing gas to pass therethrough in the vertical direction are provided respectively in contact with the entire side faces as shown in FIG. 3. Hereafter, the configuration of the ducts 35 and 36 is illustrated with the duct 35 as an example.

The duct 35 has one end opening 37 at the upper end of the casing 30, and the other end of the duct 35 is open, at a position below the casing 30, for example, to the outside of the coating and developing treatment system 1. As for the material of side parts 38 on the casing 30 side of the duct 35, a material with good heat conduction, for example, aluminum is used. Meanwhile, for side parts 39 opposite to the aforesaid side parts 38, that is, the side parts 39 on the outer side of the casing 30, a material with low heat conduction, for example, porous ceramic is used. This makes it possible to conduct easily heat radiated from the pre-baking unit 34 in the casing 30 into the duct 35 and further to prevent the heat conducted into the duct 35 from leaking from the side part 39 of the duct 35 to the outside. It should be noted that the material with good heat conduction or the material with low heat conduction may be used for the whole duct 35. Furthermore, it is also adoptable to provide on the member constituting the side part 39 a resin material having a predetermined thickness or to provide a heat insulating spongy member.

Figure 5:
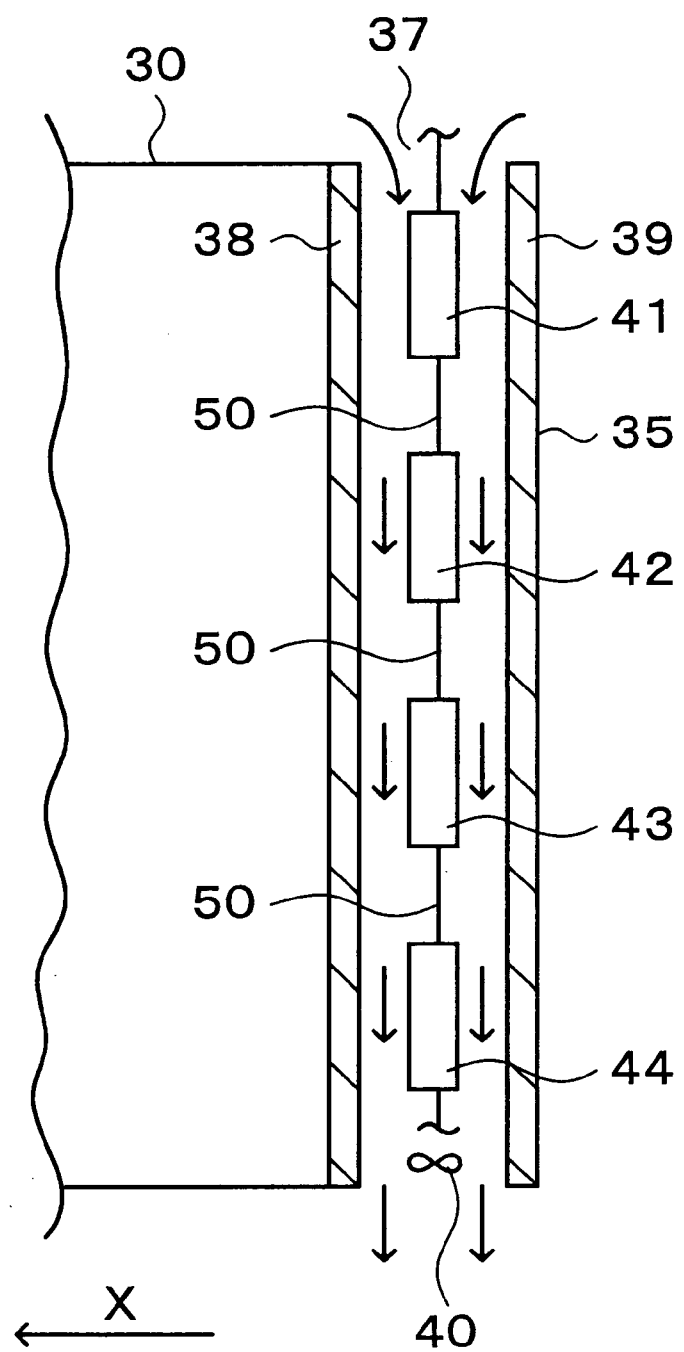
FIG. 5 is an explanatory view of a vertical cross section of the third processing apparatus schematically showing a configuration of the inside of a duct.

In the duct 35, a fan 40 as an air current generating mechanism is provided as shown in FIG. 5 to form a descending air current in the duct 35 so as to cause an atmosphere in the processing station 3 to flow into the duct 35 through the opening 37 thereof and to exhaust it from the lower part of the duct 35. A heat transporter of the present invention is constituted by the fan 40 and the air current formed by the fan 40 in this embodiment.

In the duct 35, cooling plates 41, 42, 43 and 44 in the form of a substantially rectangular solid, which contact the air current in the duct 35 to cool the air current, are arranged in a line in the vertical direction. For the cooling plates 41 to 44, a material with good heat conduction, for example, aluminum is used.

Figure 6:
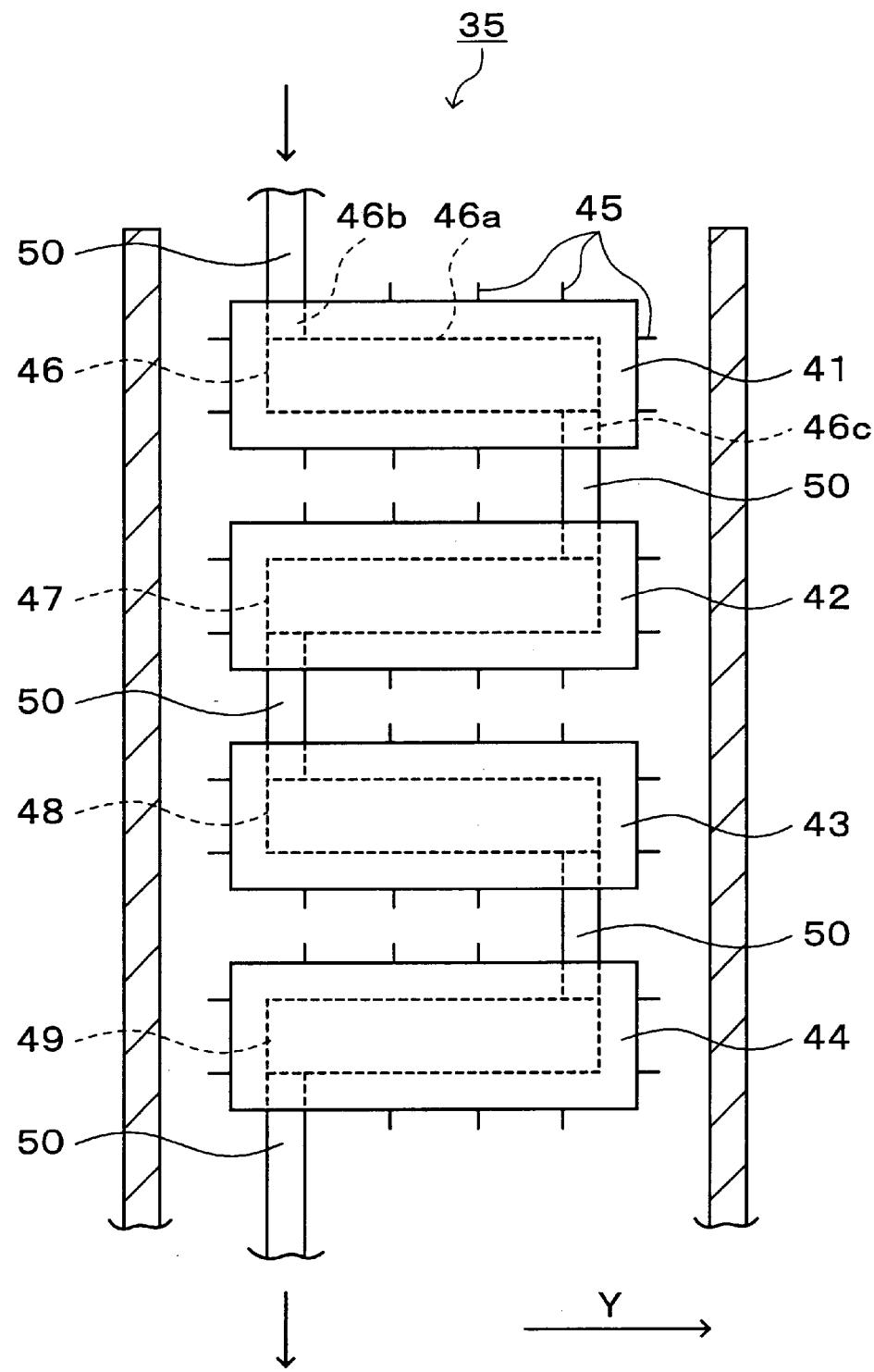
FIG. 6 is an explanatory view of a vertical cross section showing a configuration of cooling plates in the duct.

Each of the cooling plates 41 to 44 is provided with a plurality of fins 45 on its surface as shown in FIG. 6 to be constituted to have a greater area in contact with the air current in the duct 35. In the cooling plates 41 to 44, conduits 46 to 49 for allowing a cooling water as a coolant to pass therethrough are provided respectively to exhaust the heat which has conducted from the air current in the duct 35 to each of the cooling plates 41 to 44 so as to maintain each of the cooling plates 41 to 44 at a low temperature. For example, the conduit 46 has a space 46*a* provided inside the cooling pate 41, an inlet 46*b* leading from above the cooling plate 41 to the space 46*a*, and an outlet 46*c* leading from the space 46*a* to below the cooling plate 41, so that a cooling water flowing into the cooling plate 41 from a not shown coolant supply source is once stored in the space 46*a*, where the heat of the cooling plate 41 is conducted to the cooling water. It should be noted that each of the cooling plates 41 to 44 may be directly attached to the side part 38 on the casing 30 side of the duct 35 corresponding to the heat treatment unit, for example, the pre-baking unit 34.

Further, the conduits 46 to 49 of the cooling plates 41 to 44 which are adjacent to each other in the vertical direction are connected by a connecting pipe 50 so that the cooling water flowing thereinto from the uppermost cooling plate 41 passes through the inside of the cooling plates 41 to 44 in the order to flow out from the lowermost cooling plate 44. The above-described cooling water is supplied, for example, from the not shown coolant supply source, and the cooling water which has passed through the cooling plates 41 to 44 is returned again to the coolant supply source to be temperature controlled. It should be noted that the configuration of the duct 36 and the inside of the duct 36 is the same as that of the duct 35, and thus the explanation thereof is omitted.

Figure 7:
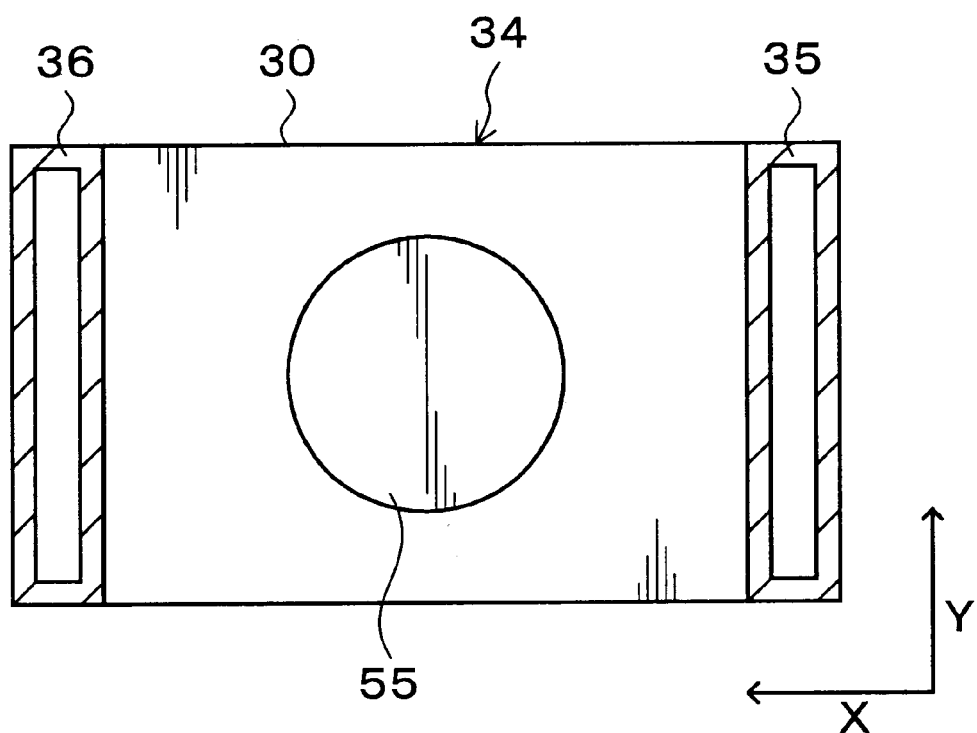
FIG. 7 is an explanatory view of a horizontal cross section schematically showing a configuration of a pre-baking unit.

The above-described pre-baking unit 34 has a thick heating plate 55 in a disc shape for mounting the wafer W, for example, on its center part and heating it as shown in FIG. 7 so as to heat treated the wafer W by mounting the wafer W on the heating plate 55 heated at a predetermined temperature for a predetermined period of time. Further, the wafer W can be carried into the pre-baking unit 34 from the side faces in the Y-direction where there are no ducts 35 and 36.

The fourth processing apparatus G4, as shown in FIG. 1, has a casing 60 in the form of a substantially rectangular solid and ducts 61 and 62 on both side faces in the X-direction as in the third processing apparatus G3. In the casing 60, as shown in FIG. 4, a cooling unit 65, an extension and cooling unit 66, an extension unit 67, a post-exposure baking unit 68 for performing a heat treatment after exposure, and a post-baking unit 69 for performing a heat treatment after a developing treatment are, for example, five-tiered in the order from the bottom. It should be noted that the remaining configuration is the same as that in the third processing apparatus G3, and thus the description thereof is omitted.

In a center part of the interface section 4, a wafer carrier 70 is provided. The wafer carrier 70 is configured to be freely movable in the X-direction (the vertical direction in FIG. 1) and the Z-direction (the perpendicular direction), and to be freely rotatable in a θ-direction (a direction of rotation about the Z-axis), so that it can access to the extension and cooling unit 66 and the extension unit 67 which are included in the fourth processing apparatus G4, an edge exposure unit 71, and the not-shown aligner to carry the wafer W to each of them.

Operations of the third processing apparatus G3 in the coating and developing treatment system 1 configured as above are explained together with steps of a photolithography process.

First, before the start of processing of the wafer W, the heating plate 55 of the pre-baking unit 34 in the third processing apparatus G3 is heated to a heating temperature for the wafer W, for example, 140° C. and maintained. In this event, the fans 40 of the ducts 35 and 35 are operated to cause the atmosphere in the processing station 3 to flow into the ducts 35 and 36 through the openings 37, which forms descending air currents in the ducts 35 and 36. Furthermore, the cooling water at a low temperature is started to be supplied from the not shown coolant supply source to maintain the cooling plates 41 to 44 at low temperatures. Thereby, the heat generated by the heating plate 55 of the pre-baking unit 34 is conducted to the ducts 35 and 36 and is transported by the air currents flowing therethrough. Then, the air currents contact the cooling plates 41 to 44 to allow the heat transfer to the cooling plates 41 to 44, so that the air currents in the ducts 35 and 36 are cooled. Further, the heat transferred to the cooling plates 41 to 44 is delivered to the cooling water and exhausted. The cooled air currents are exhausted from below the ducts 35 and 36, for example, into the clean room where the coating and developing treatment system 1 is installed.

Then, the processing of the wafer W is started, the wafer carrier 7 first takes out one unprocessed wafer W from the cassette C and carries it to the adhesion unit 32 which is included in the third processing apparatus G3. The wafer W, which is coated with an adhesion promoter such as HMDS for enhancing adhesion to the resist solution in the adhesion unit 32, is then carried, for example, to the cooling unit 31 by the main carrier 13 where it is cooled to a predetermined temperature.

Thereafter, the wafer W is carried to the resist coating unit 17 or 19 and is subjected to a resist coating treatment. The wafer W formed with a resist film is thereafter carried to the pre-baking unit 34. The wafer W carried to pre-baking unit 34 is mounted on the heating plate 55 and is heat treated for a predetermined period of time. The wafer W for which the heat treatment has been finished is carried to the extension and cooling unit 66.

Then, the wafer W is taken out of the extension and cooling unit 66 by the wafer carrier 70 and is carried the edge exposure unit 71 where the edge portion of the wafer W is exposed to light. The wafer W for which the edge exposure has been finished is held again by the wafer carrier 70 and is carried to the aligner (not shown). The wafer W for which the exposure processing has been finished is carrier to the extension unit 67 by the wafer carrier 70 and then carried to the post-exposure baking unit 68 and the cooling unit 65 in sequence by the main carrier 13 to undergo predetermined processing.

Thereafter, the wafer W is carried to the developing unit 18 or 20 and is subjected to a developing treatment. Then, the wafer W that has been subjected to the developing treatment is carried to the post-baking unit 69 and is heated. Thereafter, the wafer W is carried to the cooling unit 31 and is cooled to a predetermined temperature. Then, the wafer W is carried to the extension unit 33 and is returned to the cassette C in the cassette station 2 by the wafer carrier 7. Through the above steps, a series of photolithography process is finished.

According to the above embodiment, the heat generated from the pre-baking unit 34 is transported by the air currents flowing in the ducts 35 and 36 before discharged into the processing station 3, which can prevent an increase in temperature in the processing station 3. Therefore, it is possible to prevent an increase in temperature of the wafer W by the atmosphere in the processing station 3 while the wafer W is carried between each processing unit.

Further, the air currents in the ducts 35 and 36 which have received the heat from the pre-baking unit 34 can be cooled by the cooling plates 41 to 44, which can prevent the air currents from flowing while holding a large amount of heat and exerting thermal influence, for example, on the cooling unit 31 and the like arranged at a downstream location. Furthermore, it also becomes possible to exhaust the air currents as they are into the clean room which is temperature controlled.

The space 46a is provided in the conduit 46 in the cooling plate 41, so that the cooling water is once stored in the space 46a. This makes it possible to secure a period of time enough for the heat which has been delivered from the air current in the duct 35 to the cooling plate 41 to be conducted to the cooling water, so that the heat exchange can be effectively performed.

The provision of the fins 45 to the cooling plates 41 to 44 increases surface areas of the cooling plates 41 to 44 to increase an area in contact with the air currents, so that the air currents can be effectively cooled.

The ducts 35 and 36 are attached on the two sides in the X-direction of the casing 30 of the third processing apparatus G3 in the above embodiment, and may be provided only on either side of the side faces of the casing 30 or may be provided on three sides including a side face in the Y-direction. Especially when the ducts are provided on three sides, the heat generated from the third processing apparatus G3 is insulated more greatly to decrease the heat amount discharged into the processing station 3.

The fans 40 form the descending air currents in the ducts 35 and 36 in the above embodiment, but may form ascending air currents. This makes it possible to form air currents preferably without opposing gas which is heated to ascend. Further, the gas holding a large amount of heat is allowed to flow to the upstream where there is no processing unit such as the cooling unit 31 or the like which is susceptible to thermal influence, so as to suppress to the minimum the influence on the processing unit.

Figure 8:
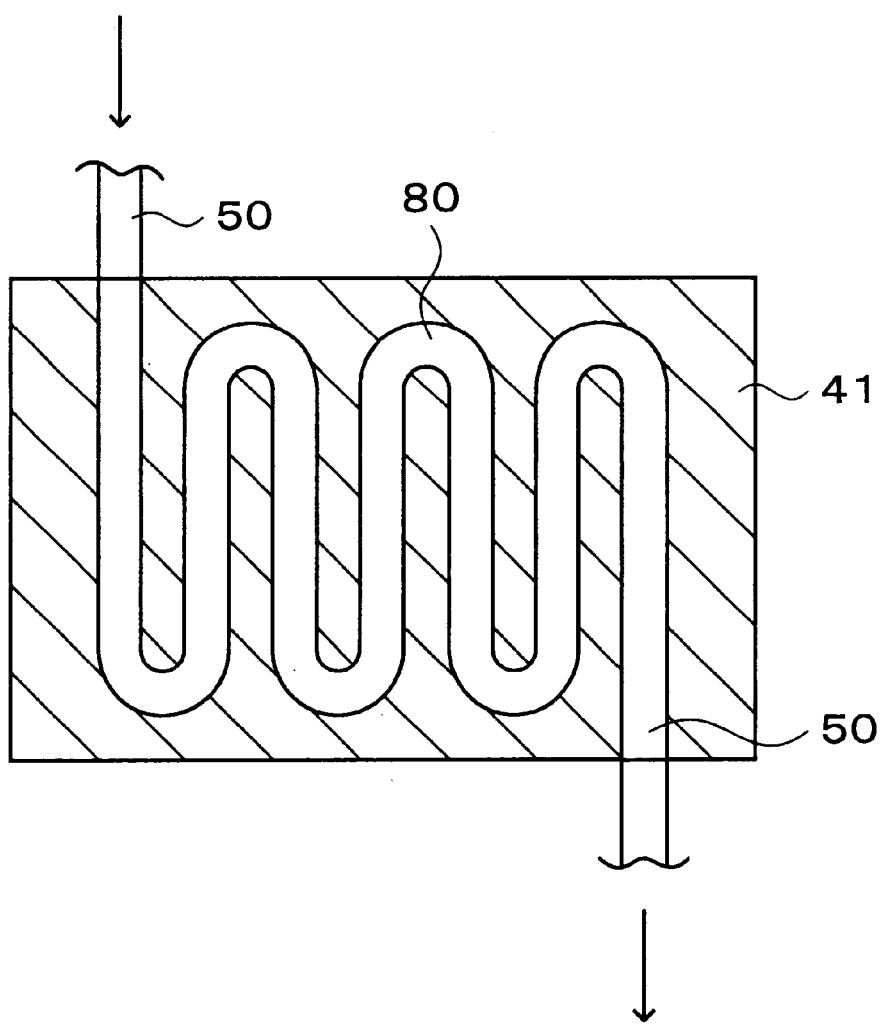
FIG. 8 is an explanatory view of a vertical cross section showing another configuration example of a conduit passing through the cooling plate.
Figure 9:
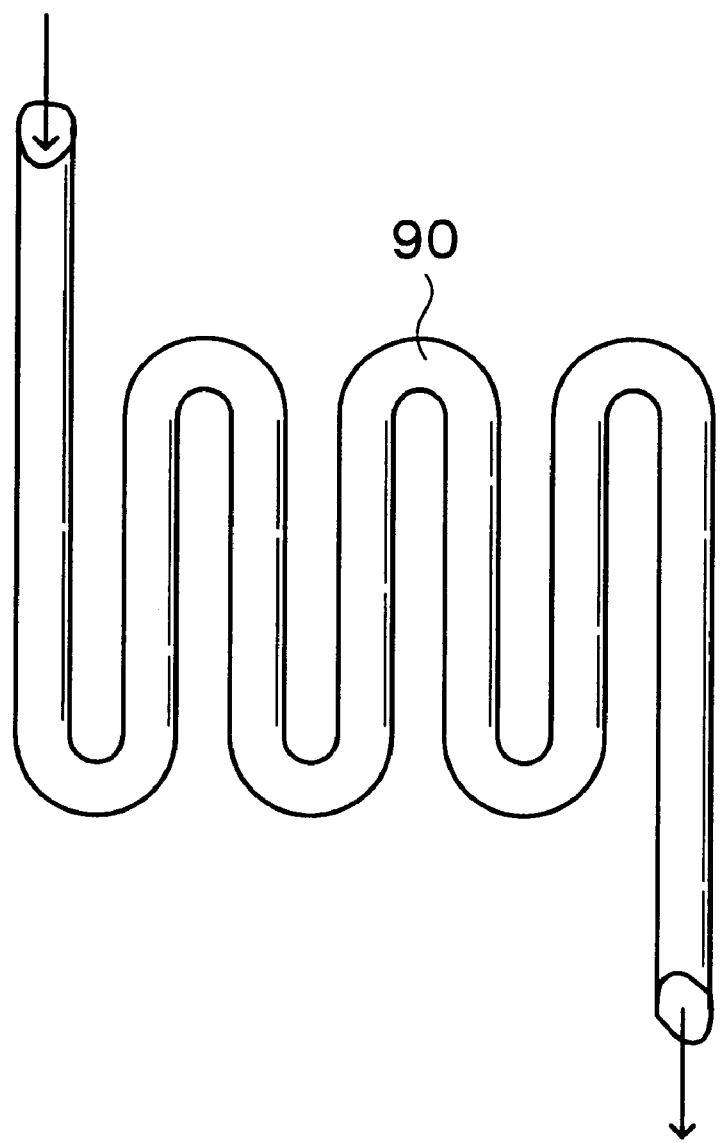
FIG. 9 is an explanatory view showing another configuration example of a conduit through which a cooling water passes.

Further, while the conduit 46 having the space 46a is provided in the above-described cooling plate 41, another pattern is adoptable in which a conduit 80 is provided meandering in the cooling plate 41 as shown in FIG. 8. Alternatively, a conduit 90 in an exposed state may be provided meandering as shown in FIG. 9. Incidentally, the conduit 90 may be provided with fins directly attached thereto to increase its surface area.

Figure 10:
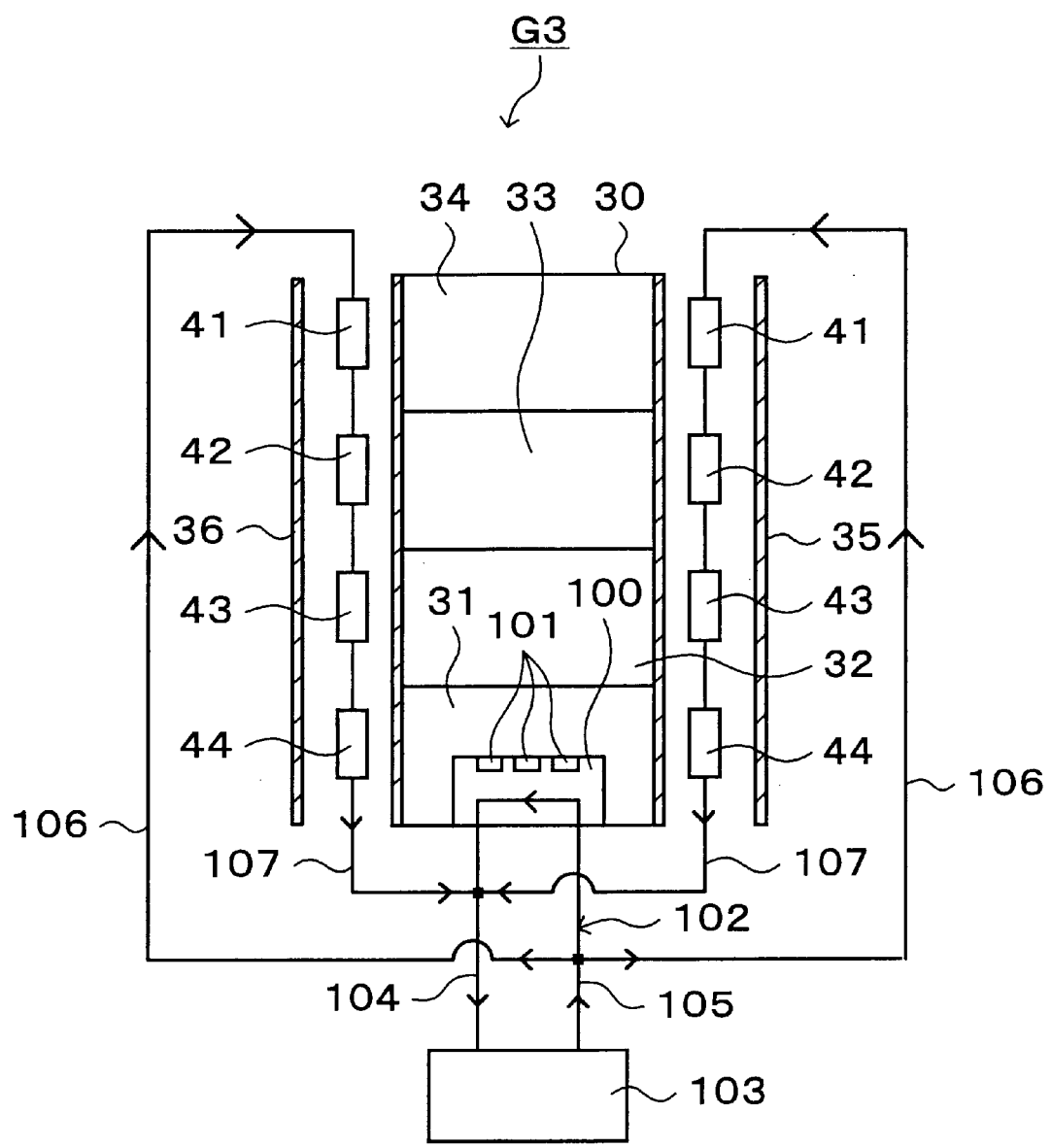
FIG. 10 is an explanatory view schematically showing an example of piping for the cooling water.

Further, it is also adoptable to use as the cooling water for cooling the cooling plates 41 to 44 the cooling water as a coolant used in the other cooling treatment unit, for example, the cooling unit 31 as a cooling unit. For example, the cooling unit 31 is provided with a cooling plate 100 for mounting the wafer W thereon and cooling it as shown in FIG. 10. The cooling plate 100 is provided with Peltier elements 101, so that the cooling plate 100 can be maintained at a predetermined temperature by the Peltier elements 101. In the cooling plate 100, a piping 102 is provided which allows a cooling water to flow therethrough to exhaust the heat generated in the Peltier elements 101 to the outside of the cooling unit 31. The piping 102 has a return passage 104 for returning the cooling water to a coolant supply unit 103 having a temperature control function and a supply passage 105 for supplying the cooling water from the coolant supply unit 103 to the cooling plate 100 to form a circulation passage.

The supply passage 105 is provided with duct supply passages 106 branching off from the supply passage 105 and for supplying the cooling water to the uppermost cooling plates 41 of the ducts 35 and 36. Further, the return passage 104 is provided with duct return passages 107 for returning the cooling water from the lowermost cooling plates 44 to the return passage 104. This configuration makes it possible to supply a part of the cooling water to be used in the cooling plate 100 to the cooling plates 41 of the ducts 35 and 36, to use the cooling water as the cooling water for the cooling plates 41 to 44, and thereafter to return it to the coolant supply unit 103. This eliminates the necessity for separately providing an apparatus for supplying the cooling water to the cooling plates 41 to 44, and it is possible to supply the cooling water to the cooling plates 41 to 44 using the existing circulation passages. It should be noted that the cooling water for the cooling plates 41 to 44 may be supplied from the supply passage 105 to the lowermost cooling plates 44 and be returned from the uppermost cooling plates 41 to the return passage 104.

Figure 11:
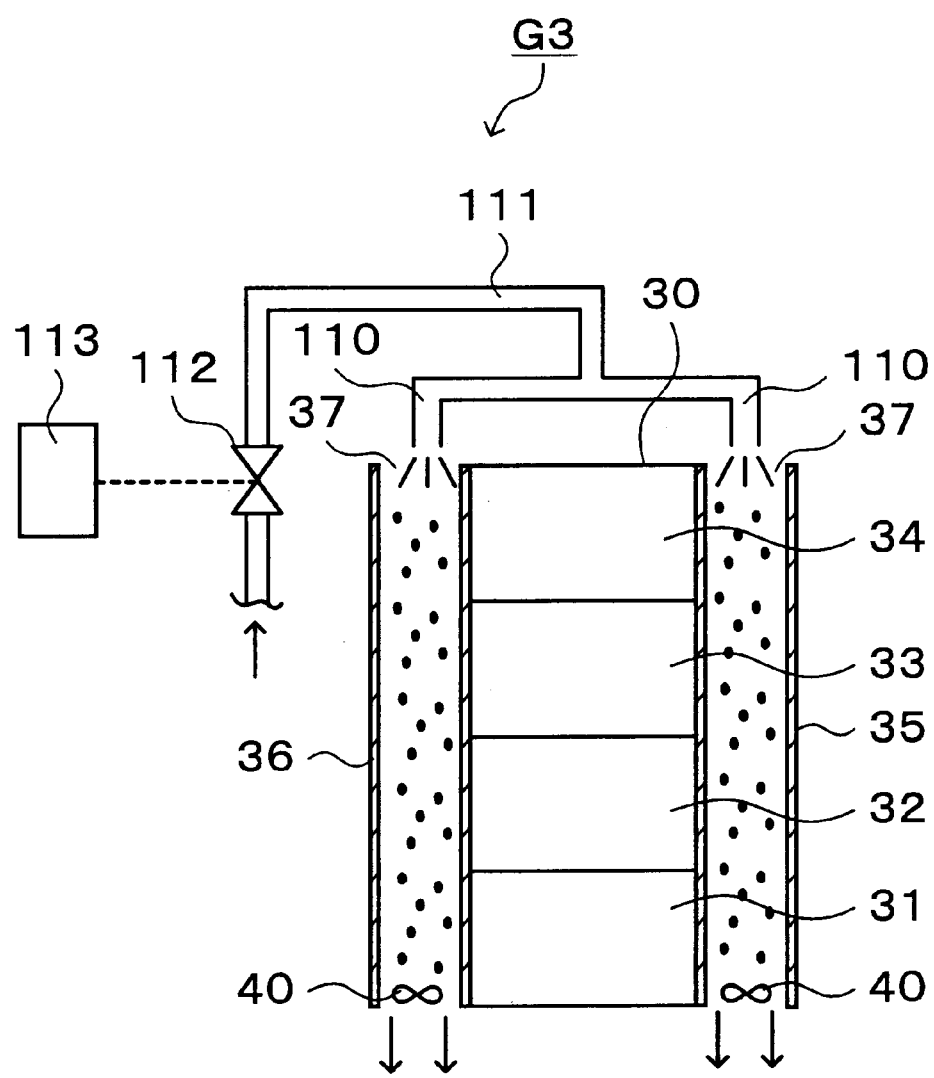
FIG. 11 is an explanatory view of a vertical cross section showing a configuration of the third processing apparatus when mist is supplied into the ducts.

While the cooling plates 41 to 44 for cooling the air currents in the ducts 35 and 36 are provided in the above embodiment, mist supply mechanisms for supplying a mist of pure water as a cooling water may be provided in the ducts 35 and 36 to cool the air currents. In this application, for example, supply nozzles 110 for jetting the mist into the ducts 35 and 36 are provided at the openings 37 of the ducts 35 and 36 as shown in FIG. 11. A supply pipe 111 connects the supply nozzles 110 and a not shown mist supply source, and is provided with a valve 112 capable of changing the amount of supply of the mist. The degree of open/close of the valve 112 is controlled by a controller 113, so that the jet timing and the amount of jet of the mist can be controlled by the controller 113. For example, after the start of the processing of the wafer W, the mist is intermittently jetted to draw heat from the air currents in the ducts 35 and 36 by latent heat of the mist to thereby cool the air currents. This can also cool the air currents in the ducts 35 and 36 so as to suppress thermal influence exerted on the processing units at the downstream locations.

While the cooling plates 41 to 44 through which the coolant passes are provided in the ducts 35 and 36 in the above embodiment, a heat absorbing member, for example, aluminum or the like, for absorbing the heat of the air currents in the ducts 35 and 36 may be simply provided in the ducts 35 and 36. This can also absorb vigorously the heat generated from the pre-baking unit 34 and exhaust the heat by the air currents in the ducts 35 and 36, resulting in prevention of an increase in temperature in the processing station 3.

Figure 12:
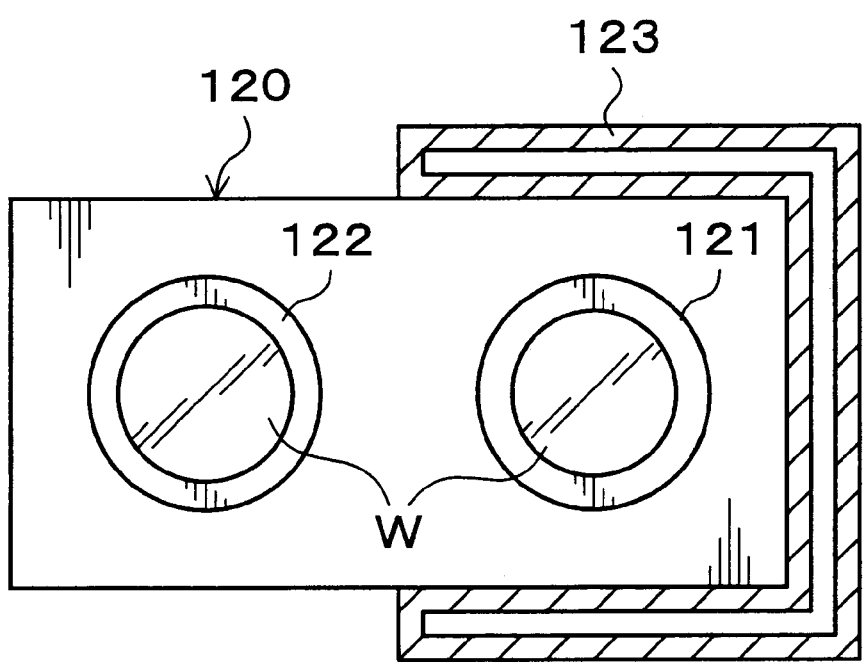
FIG. 12 is an explanatory view of a horizontal cross section schematically showing a configuration of a heat treatment unit.

Further, a heat treatment unit having a heating section and a cooling section may be provided in place of the above-described pre-baking unit 34, and a duct may be provided only on the heating section side. For example, a heating plate 121 as the heating section and a cooling plate 122 as the cooling section are provided side by side in a heat treatment unit 120 as shown in FIG. 12. Then, a duct 123 having the same configuration as that of the above-described duct 35 is provided on side faces on the heating plate 121 side of the casing 30 to surround the heating plate 121. Thereby, it becomes possible to prevent the radiation of heat from the heating plate 121 side to prevent an increase in temperature in the processing station 3 even in the case of using the heat treatment unit 120.

Figure 13:
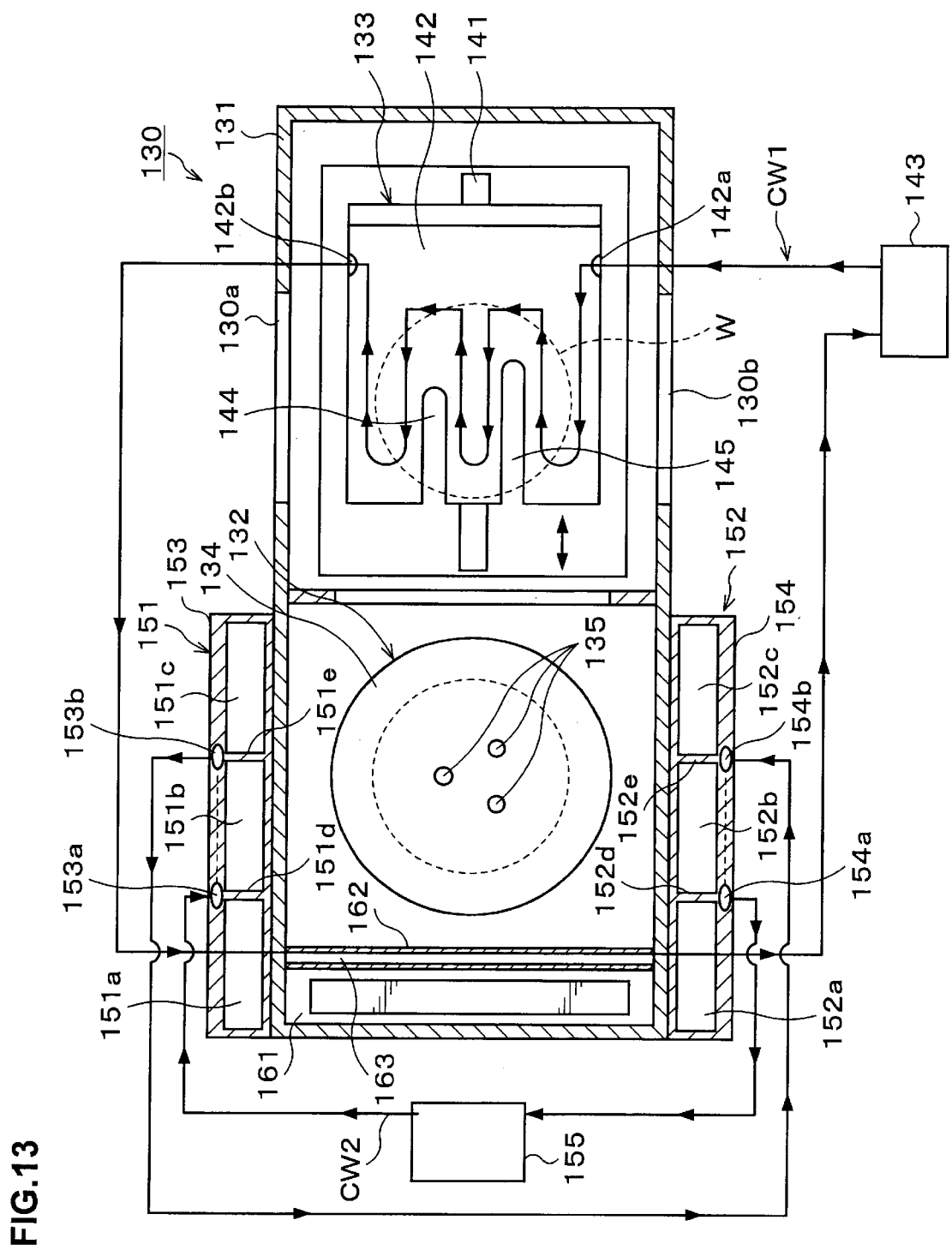
FIG. 13 is an explanatory view of a horizontal cross section schematically showing another configuration of the heat treatment unit.

What is shown in FIG. 13 illustrates another example of the heat treatment unit. A heat treatment unit 130 has a heating section 132 and a cooling section 133 in a casing 131. The casing 131 also serves as a casing of the processing apparatus, for example, the third processing apparatus G3 or the fourth processing apparatus G4. The heating section 132 has a heating plate 134, and a heater is embedded in the heating plate 134. Therefore, it is possible to perform a predetermined heat treatment for the wafer W on the heating plate 134. The heating plate 134 is provided with three raising and lowering pins 135 projecting from the top of the heating plate 134 when the wafer W is raised. The raising and lowering pins 135 move up and down by, for example, an appropriate drive unit such as a motor or the like.

Inside the casing 131, the cooling section 133 is provided in addition to the aforementioned heating section 132. The cooling section 133 has a cooling plate 142 which moves along a transfer rail 141 and moves up and down. The cooling plate 142 forms into a substantially square flat plate as a whole, in which a cooling fluid at a predetermined temperature (for example, 23° C.), for example, a water CW1, which is supplied from a constant temperature water supply source 143 located outside, circulates from an inlet 142a of the cooling plate 142 through a flow passage formed in the cooling plate 142 and flows out from an outlet 142b of the cooling plate 142. This provides a configuration for cooling the wafer W mounted on the cooling plate 142.

Incidentally, the cooling plate 142 is formed with two slits 144 and 145 at an end part on the aforesaid heating section 132 side. These slits 144 and 145 are provided to prevent the raising and lowering pins 135 from obstructing when the cooling plate 142 moves to the heating section 132 side and is located above the heating plate 134 to receive the wafer W supported by the raising and lowering pins 135 at a position above the heating plate 134. Therefore, the cooling plate 142 can deliver/receive the wafer W to/from the raising and lowering pins 135 at a position above the heating plate 132.

Ducts 151 and 152 are attached on both sides outside the casing 131 corresponding to the heating section 132. The duct 151 is divided into a first duct 151a, a second duct 151b and a third duct 151c through which air currents pass in the vertical direction. The duct 152 is also divided into a first duct 152a, a second duct 152b and a third duct 152c through which air currents pass in the vertical direction. The first ducts 151a and 152a are flow passages for performing unit-exhaust, for example, of processing units as the various kinds of units mounted on the third processing apparatus G3 or the fourth processing apparatus G4. For example, the air in the whole of a unit is exhausted to the outside of the processing apparatus through the first ducts 151a and 152a. The second ducts 151b and 152b are flow passages for exhausting air at high temperatures in the processing units as the various kinds of units mounted on the third processing apparatus G3 or the fourth processing apparatus G4, for example, air at high temperatures generated, for example, from units having a heating plate. The third ducts 151c and 152c are flow passages for exhausting into the exhaust a solvent and various kinds of treatment solutions, for example, HMDS (hexamethyldisilazane) used for performing, for example, an adhesion treatment for the wafer W in the processing units as the various kinds of units mounted on the third processing apparatus G3 or the fourth processing apparatus G4.

Figure 14:
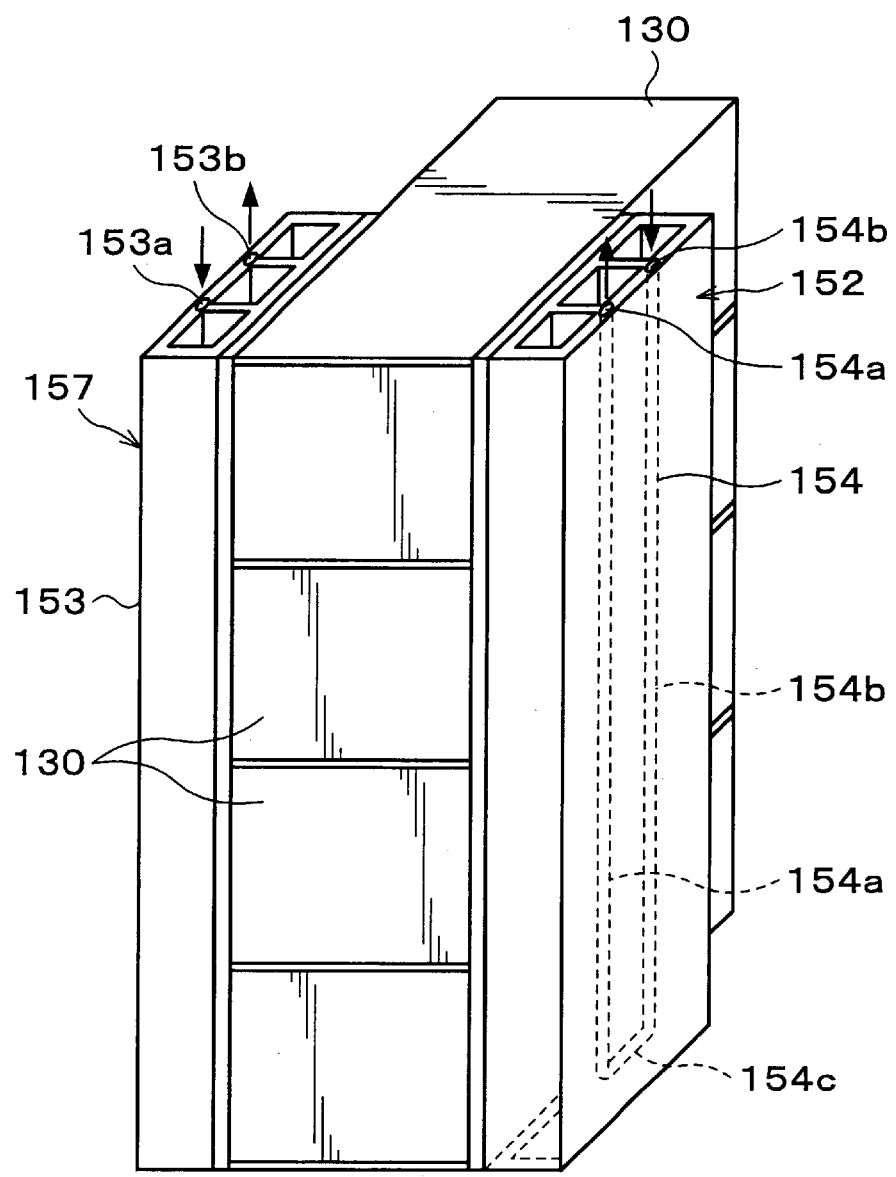
FIG. 14 is a perspective view of a processing apparatus having the heat treatment unit in FIG. 13.

It should be noted that, as shown in FIG. 14, outer panels 153 and 154, when applied, for example, to the third processing apparatus, have a length in the vertical direction over all the side faces of the heat treatment units 130 which are multi-tiered. In other words, the ducts 151 and 152 can perform exhaust from each of the heat treatment units 130.

The first ducts 151a and 152a, the second ducts 151b and 152b and the third ducts 151c and 152c can be set with the rate of exhaust flow per unit of time changed, so that they can perform various kinds of exhaust at an optimal and minimum rate of exhaust flow in accordance with characteristics of air to be exhausted.

It is possible to make, for example, using aluminum the first ducts 151a and 152a, the second ducts 151b and 152b and the third ducts 151c and 152c in the ducts 151 and 152 and to form the outer panels 153 and 154 located outside them. Further, cooling flow passages 153a and 153b are formed in the vertical direction inside the outer panel 153, and cooling flow passages 154a and 154b are formed in the vertical direction inside the outer panel 154.

The cooling flow passages 153a and 153b are formed to be located exactly on the outside of partition plates 151d and 151e which partition the duct 151 into three parts. Furthermore, the cooling flow passages 154a and 154b are also formed to be located exactly on the outside of partition plates 152d and 152e which partition the duct 152 into three parts.

Through the cooling flow passages 153a and 153b and the cooling flow passages 154a and 154b, a cooling fluid at a predetermined temperature (for example, 23° C.), for example, a water CW2, which is supplied from a constant temperature water supply source 155 circulates. As shown in FIG. 14, the water supplied from the constant temperature water supply source 155, for example, enters at the top of the cooling flow passage 153a of the outer panel 153 into the outer panel 153, passes through a communicating pipe at the bottom of the outer panel 153 into the cooling flow passage 153b, and passes out from the top thereof. Subsequently, the water enters at the top of the cooling flow passage 154b of the outer panel 154 into the outer panel 154, passes through a communicating pipe 154c at the bottom of the outer panel 154 into the cooling flow passage 154a, passes out from the top thereof, and returns to the constant temperature water supply source 155.

A wiring accommodation unit 161 is provided in a space on the rear side of the heating section 132 in the casing 131. Various kinds of wirings and electric devices and the like are accommodated in the wiring accommodation unit 161. Between the wiring accommodation unit 161 and the heating section 132, a heat insulating panel 162 is disposed to part the wiring accommodation unit 161 from the heating section 132. This heat insulating panel 162 is made of, for example, aluminum, in which flow passages 163 for allowing a cooling fluid to pass therethrough in the horizontal direction are formed at multi levels in the vertical direction.

Further, the cooling water flowed out from the outlet 142b of the cooling plate 142, as shown in FIG. 13, passes through the flow passage 163, and thereafter flows out of the flow passage 163 to return to the constant temperature water supply source 143.

The periphery of the heat treatment unit 130 has the above-described configuration. According to this example, the ducts 151 and 152 through which air passes are provided on both sides of the casing 131 opposite to the heating section 132, so that the heat generated by the heating section 132 is first prevented by the air from conducting to the outside of the heat treatment unit 130. In addition, the cooling flow passages 153a, 153b, 154a and 154b are provided inside the outer panels 153 and 154 of the ducts 151 and 152, and water as the cooling fluid flows therethrough. Thus, the outer panels 153 and 154 serve as cooling panels such that this cooling fluid absorbs the heat generated by the heating section 132 to make it possible to further prevent the heat conduction to the outside of the casing 131.

Meanwhile, when the casing 131 is cooled direct by the cooling fluid, the heat abruptly transfers from the heating section 132 to the casing 131, resulting in degraded stability of heating at the heating section 132. Moreover, compensation for a decrease in temperature accompanying the heat transfer requires supply of a greater amount of electricity to the heater of the heating section 132.

In this point, the heat is once insulated by the ducts 151 and 152, that is, the air currents in the ducts on both sides of the casing 131 corresponding to the heating section 132 in the above embodiment so as to eliminate abrupt transfer of the heat from the heating section 132 to the casing and to the outside, which enables stable heating. Further, since the heat does not abruptly transfer, it is possible to reduce correspondingly the electricity for compensating a decrease in temperature to a very small amount to thereby save the required electricity as a whole.

The ducts 151 and 152 themselves are divided into the first ducts 151a and 152a, the second ducts 151b and 152b, and the third ducts 151c and 152c respectively, in which the exhaust at a high temperature is allowed to flow in the second ducts 151b and 152b. The aforesaid cooling flow passages 153a and 153b are located exactly on the outside of the partition plates 151d and 151e which partition the duct 151 into three parts, and the cooling flow passages 154a and 154b are also located exactly on the outside of the partition plates 152d and 152e which partition the duct 152 into three parts. The second ducts 151b and 152b through which the exhaust at the highest temperature flows are thus located between the cooling flow passages 153a and 153b, and, the cooling flow passages 154a and 154b respectively. Therefore, the heat itself of the exhaust flowing in the second ducts 151b and 152b is also prevented from conducting to the outside by the cooling fluid flowing through these cooling flow passages 153a and 153b and the cooling flow passages 154a and 154b.

Further, since the heat insulating panel 162 is disposed between the wiring accommodation unit 161 in which the various kinds of wirings are accommodated and the heating section 132, and water as a coolant flows through the flow passage 163 in the heat insulating panel 162, the heat generated by the heating section 132 is prevented from conducting to the wiring accommodation unit 161. The various kinds of wirings accommodated in the wiring accommodation unit 161 include signal lines from temperature sensors for measuring temperatures of the heating plate 134 and the cooling plate 142. The temperatures of the heating plate 134 and the cooling plate 142 are controlled based on signals from the temperature sensors. By suppressing thermal influence from the heating section 132 as described above, it becomes possible to suppress disturbance and to conduct accurate and stable temperature control.

Moreover, since the water as the coolant flowing through the aforesaid flow passage 163 is the water used for cooling the cooling plate 142, it is unnecessary to receive supply of a coolant from another coolant supply source in particular.

It should be noted that the heat treatment unit 130 having the aforementioned configuration is installable in either of the third processing apparatus G3 and in the fourth processing apparatus G4. Further, since the heat treatment unit 130 has on both sides carrier inlet/outlets 130a and 130b having a shutter which freely opens/closes. Accordingly, when the heat treatment unit 130 is installed in the third processing apparatus G3, both of the wafer carrier 7 and the main carrier 13 can deliver/receive the wafer W to/from the cooling plate 142, and when it is installed in the fourth processing apparatus G4, both of the wafer carrier 70 and the main carrier 13 can deliver/receive the wafer W to/from the cooling plate 142.

While the third processing apparatus G3 is explained in the above embodiment, the fourth processing apparatus G4 may naturally have the same configuration.

Further, the embodiment described in the above is for the processing apparatus for the wafer in the photolithography process in semiconductor wafer device fabrication processes. The present invention is also applicable to a processing apparatus for a substrate other than the semiconductor wafer, for example, for an LCD.

According to the present invention, it is possible to prevent an increase in temperature of the atmosphere outside the casing, which eliminates an increase in temperature of a substrate during carriage of the substrate. This prevents an unintended variation in temperature of the substrate to thereby maintain the substrate at an appropriate temperature. This enables strict temperature control, resulting in improved yields.

What is claimed is:

1. A substrate processing apparatus for performing processing of a substrate, comprising:

a heat treatment unit which is provided in a casing of said processing apparatus and in which a heat treatment of the substrate is performed;

a duct provided on a side part of said casing, said duct having a plurality of partition plates partitioning the duct; and an air current generating mechanism for generating an air current flowing in said duct.

2. A substrate processing apparatus as set forth in claim 1, wherein said air current generating mechanism forms an ascending air current in said duct.

3. A substrate processing apparatus as set forth in claim 1, wherein a heat absorbing member for absorbing heat of said air current is provided in said duct.

4. A substrate processing apparatus for performing processing of a substrate, comprising:

a heat treatment unit which is provided in a casing of said processing apparatus and in which a heat treatment of the substrate is performed;

a duct provided on a side part of said casing;

an air current generating mechanism for generating an air current flowing in said duct; and a cooling device provided in said duct and configured to cool said air current, wherein said cooling device has a cooling plate, and said cooling plate has a flow passage for allowing a cooling fluid to pass therethrough.

5. A substrate processing apparatus as set forth in claim 4, wherein said cooling plate is provided with a fin.

6. A substrate processing apparatus as set forth in claim 4, further comprising a cooling unit for performing a cooling treatment for the substrate, wherein a coolant used during the cooling treatment by said cooling unit is used for said cooling fluid.

7. A substrate processing apparatus for performing processing of a substrate, comprising:

a heat treatment unit which is provided in a casing of said processing apparatus and in which a heat treatment of the substrate is performed;

a duct provided on a side part of said casing;

an air current generating mechanism for generating an air current flowing in said duct; and a mist supply unit for supplying a mist of a cooling water into said duct.

8. A substrate processing apparatus for performing processing of a substrate, comprising:

a heat treatment unit provided in a casing of said processing apparatus and having a heating section in which a heat treatment of the substrate is performed;

a duct provided on a side part on said heating section side of said casing;

a cooling flow passage provided in said duct for allowing a cooling fluid to flow therethrough;

a wiring accommodation unit for accommodating at least an electric wiring; and a heat insulating panel disposed between said wiring accommodation unit and said heating section and formed with a flow passage through which a cooling fluid passes.

9. A substrate processing apparatus as set forth in claim 8, wherein said cooling flow passage is provided at a position closer to an outside in said duct.

10. A substrate processing apparatus as set forth in claim 8, wherein said heat treatment unit has a cooling section for cooling the substrate, and a coolant after it is used during the cooling by said cooling section is used for the cooling fluid in said heat insulating panel.

11. A substrate processing apparatus as set forth in claim 8, wherein said duct is divided into a plurality of flow passages.

* * * * *